United States Patent
Itou et al.

(10) Patent No.: US 7,143,385 B2
(45) Date of Patent: Nov. 28, 2006

(54) WIRING DESIGN METHOD AND SYSTEM FOR ELECTRONIC WIRING BOARDS

(75) Inventors: Katsuyuki Itou, Hadano (JP); Tetsuo Sasaki, Hadano (JP); Toshiaki Okada, Hadano (JP)

(73) Assignee: Hitachi, Ltd., Tokyo (JP)

( * ) Notice: Subject to any disclaimer, the term of this patent is extended or adjusted under 35 U.S.C. 154(b) by 418 days.

(21) Appl. No.: 10/803,944

(22) Filed: Mar. 19, 2004

(65) Prior Publication Data

US 2004/0250230 A1    Dec. 9, 2004

(30) Foreign Application Priority Data

Mar. 20, 2003    (JP)    ............................. 2003-077172

(51) Int. Cl.
    *G06F 17/50*    (2006.01)
(52) U.S. Cl. ............................. 716/15; 716/14; 716/13; 716/12; 716/11
(58) Field of Classification Search ............. 716/11–15
    See application file for complete search history.

(56) References Cited

U.S. PATENT DOCUMENTS

| | | | | |
|---|---|---|---|---|
| 3,567,914 A | * | 3/1971 | Neese et al. ................... | 716/15 |
| 4,628,354 A | * | 12/1986 | Nagura ......................... | 348/145 |
| 4,630,219 A | * | 12/1986 | DiGiacomo et al. ............ | 716/9 |
| 4,638,442 A | * | 1/1987 | Bryant et al. .................. | 716/14 |
| 5,027,418 A | * | 6/1991 | Ikegaya et al. ............... | 382/150 |
| 5,139,963 A | * | 8/1992 | Suzuki et al. .................. | 438/4 |
| 5,315,535 A | * | 5/1994 | Kikuchi et al. ................. | 716/15 |
| 5,448,493 A | * | 9/1995 | Topolewski et al. ............ | 716/7 |
| 5,631,842 A | * | 5/1997 | Habra et al. .................... | 716/12 |
| 5,712,793 A | * | 1/1998 | Scepanovic et al. ........... | 716/12 |
| 5,787,009 A | * | 7/1998 | Pedersen ......................... | 716/7 |
| 6,086,628 A | * | 7/2000 | Dave et al. ...................... | 716/7 |
| 6,230,303 B1 | * | 5/2001 | Dave .............................. | 716/7 |
| 6,385,758 B1 | * | 5/2002 | Kikuchi et al. ................. | 716/2 |
| 6,519,021 B1 | * | 2/2003 | Aruga .......................... | 349/152 |
| 6,651,225 B1 | * | 11/2003 | Lin et al. ........................ | 716/4 |
| 6,687,893 B1 | * | 2/2004 | Teig et al. ...................... | 716/14 |
| 6,907,594 B1 | * | 6/2005 | Aoki ............................. | 716/13 |
| 2001/0038612 A1 | * | 11/2001 | Vaughn et al. ............... | 370/256 |

FOREIGN PATENT DOCUMENTS

JP    2002-124571    4/2002

* cited by examiner

*Primary Examiner*—Jack Chiang
*Assistant Examiner*—Naum Levin
(74) *Attorney, Agent, or Firm*—Mattingly, Stanger, Malur & Brundidge, P.C.

(57) ABSTRACT

A wiring design system when applied to wiring boards having various wiring restrictions, has a rough wiring plan at the floor plan stage so as to complete a wiring design satisfying the wiring restrictions in a short period of time while evaluating the congestion degree of the wiring. Logical connection information for wiring parts and signal group information for handling the connection information is input as a signal group. The signal group is handled as a wiring unit for a wiring path search and the signal group is divided into smaller groups. An optimum path is then determined in such a way that the divided smaller groups run adjacent to one another whenever appropriate.

12 Claims, 13 Drawing Sheets

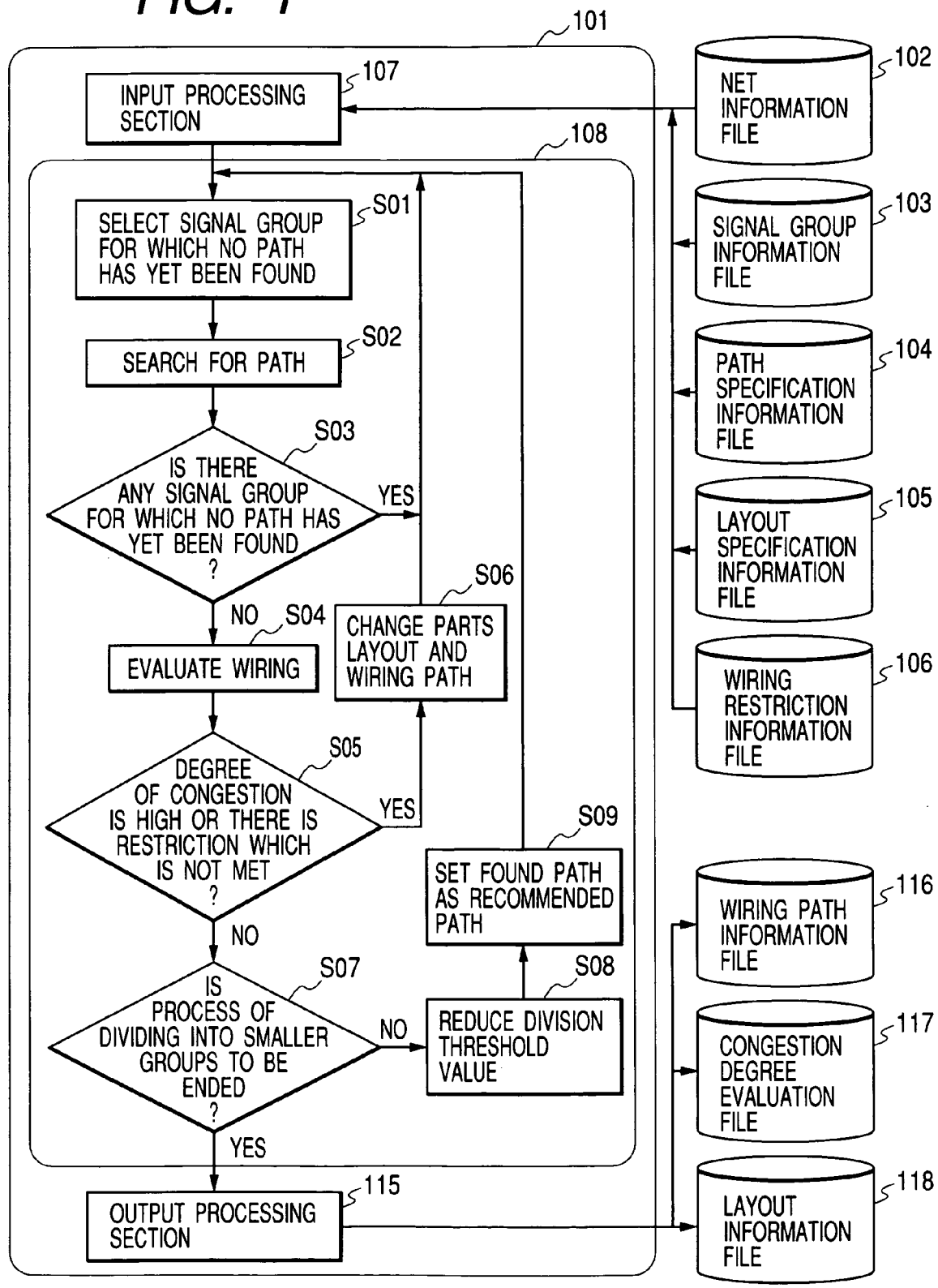

FIG. 2

Table 201:

| SIGNAL GROUP NAME OR SIGNAL NAME | START POINT X-COORDINATE | START POINT Y-COORDINATE | END POINT X-COORDINATE | END POINT Y-COORDINATE | LAYER NAME |
|---|---|---|---|---|---|
| SIG1 | 10 | 90 | 90 | 90 | L1 |
| SIG1 | 80 | 20 | 80 | 40 | L1 |
| G2 | 5 | 3 | 2 | 3 | L1 |
| G2 | 20 | 40 | 30 | 40 | L2 |
| SIG3 | 10 | 10 | 11 | 11 | L3 |
| SIG3 | 11 | 11 | 11 | 15 | L3 |

Table 202:

| SIGNAL GROUP NAME OR SIGNAL NAME | LOWER LEFT OF REGION X-COORDINATE | LOWER LEFT OF REGION Y-COORDINATE | UPPER RIGHT OF REGION X-COORDINATE | UPPER RIGHT OF REGION Y-COORDINATE | LAYER NUMBER |
|---|---|---|---|---|---|
| G1 | 10 | 90 | 90 | 90 | 2~4 |
| G1 | 80 | 20 | 80 | 40 | 2~4 |
| SIG2 | 5 | 3 | 2 | 3 | 1 |
| SIG2 | 20 | 40 | 30 | 40 | 1 |
| G3 | 10 | 10 | 11 | 11 | 3 |
| G3 | 11 | 11 | 11 | 15 | 4 |

FIG. 8
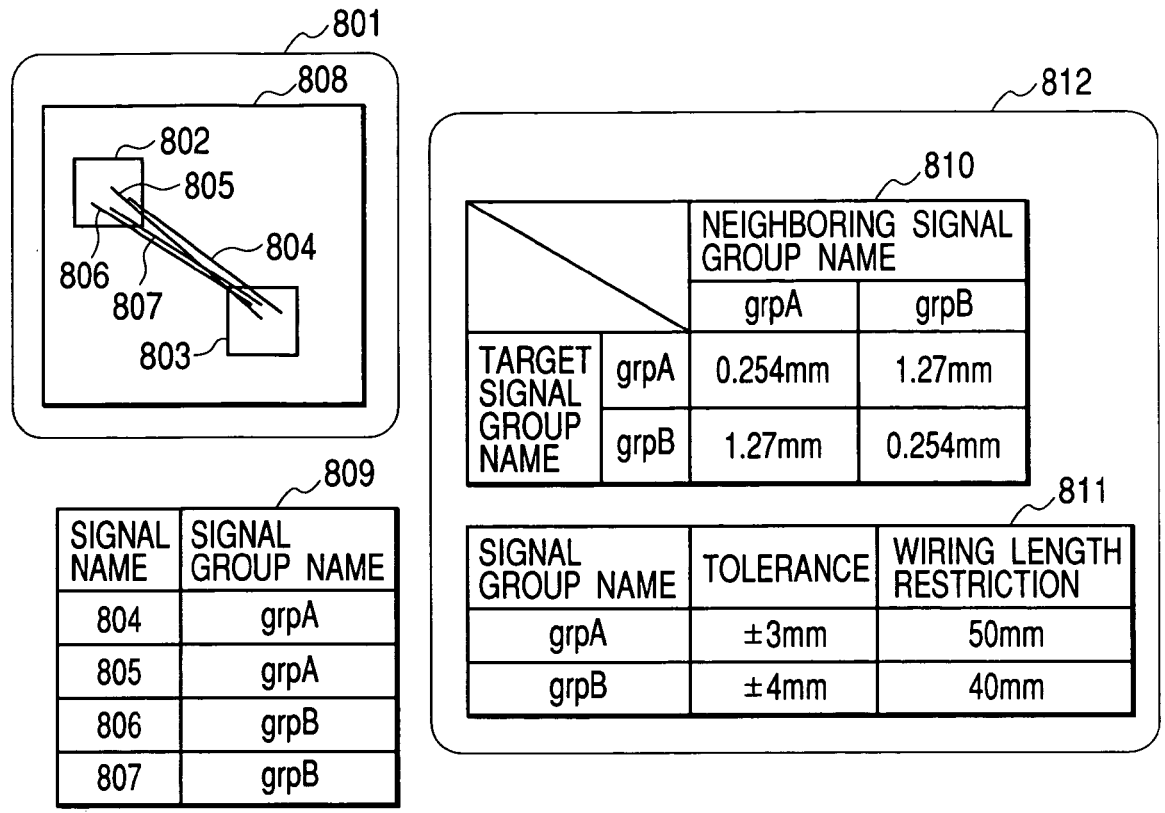
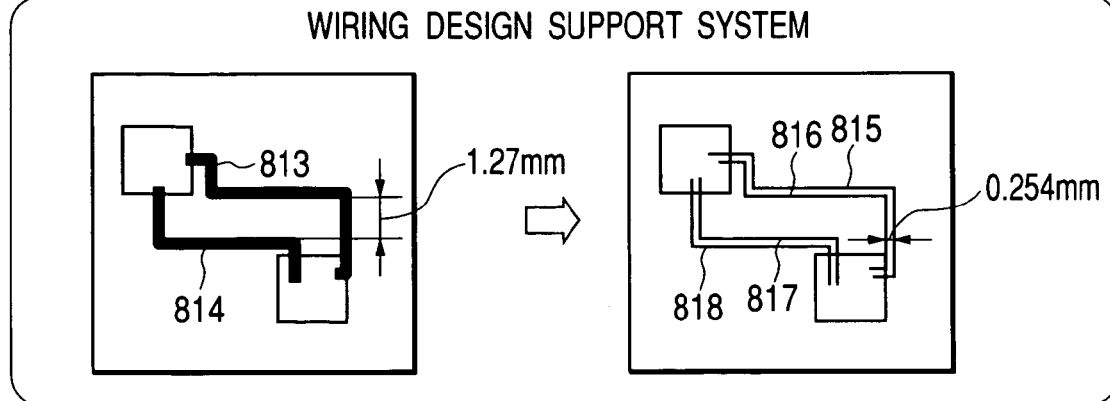
WIRING DESIGN SUPPORT SYSTEM
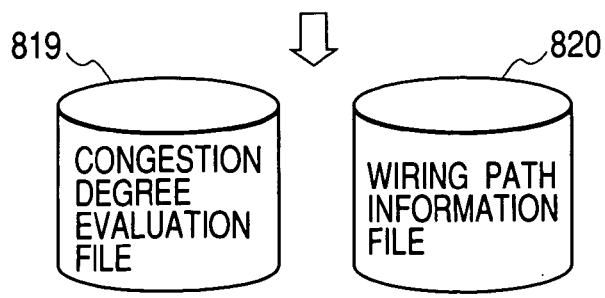

WIRING DESIGN METHOD AND SYSTEM FOR ELECTRONIC WIRING BOARDS

BACKGROUND OF THE INVENTION

The present invention relates to a wiring design system and method, and more particularly to a wiring design system and method which is advantageous when applied to electronic wiring boards having various wiring restrictions, wherein the system and method shows a rough wiring plan at the floor plan stage so as to complete a wiring design satisfying the wiring restrictions in a short period of time.

Attempts have been made to automate the design of wiring on electronic wiring boards using a computer system.

Description will be made below of problems with prior art wiring design techniques with reference to FIG. 12.

FIG. 12 is a schematic diagram showing an example of how to lay out signal (line) groups having proximity wiring restrictions.

Generally, the wiring on an electronic wiring board is designed under various wiring restrictions since each signal varies in its characteristics and interference occurs between the wires.

For example, if signals on a wiring board have different distance restrictions with respect to their neighboring signals, the wiring density may decrease depending on the arrangement of the wiring paths.

FIG. 12 shows distance restrictions (denoted by reference numeral 1203) between neighboring parallel lines, in which a (minimum) distance is set between each combination of two signal groups. That is, for example, a wire belonging to the signal group groupA and that belonging to the signal group groupB must be spaced 4 units or more apart. It should be noted that a signal group is a group consisting of (signal) wires having the same characteristics.

If wires of the signal group groupA and the signal group groupB have a positional relationship as shown in a wiring state 1201 (in FIG. 12), their wiring restrictions prevent them from being densely arranged.

To overcome this problem, the wires of the same signal group may be disposed adjacent to one another to achieve a dense wiring arrangement; for example, a signal (wire) 1204 of the signal group groupA may be disposed next to a signal (wire) 1206 of the same group, as shown in a wiring state 1202 (in FIG. 12).

Increased speed of semiconductor integrated circuits has made it necessary to match the characteristics of a plurality of signals, which requires that their wiring lengths and wiring paths be made as equal as possible.

To accomplish this, the technique disclosed in Japanese Laid-Open Patent Publication No. 2002-124571 uses the concept of virtual wiring. This technique generates detailed wiring from rough wiring by dividing the virtual wiring. In virtual wiring, a plurality of nets which must be made equal in their characteristics are grouped together and handled as a single virtual net.

SUMMARY OF THE INVENTION

The above patent publication describes that the above technique can make effectively equal characteristics (such as wiring length, wiring capacity, wiring path, and wiring pattern) of a plurality of nets which must be made equal in their characteristics.

However, the technique may entail the problem of increased wiring length or increased wiring space, depending on how parts are arranged on the wiring board.

Description will be made below of problems arising when parts block wiring on a wiring board with reference to FIGS. 13A to 13D.

FIGS. 13A to 13D are schematic diagrams illustrating wiring patterns formed when parts block wiring on a wiring board.

Referring to FIG. 13A, let us consider how to find a path for signal lines (indicated by reference numeral 1303) between two parts 1301 and 1302. The characteristics of the signal lines must be substantially equal.

The conventional technique will draw the virtual net 1305 shown in FIG. 13B and then determine a path based on this virtual net.

However, since parts 1304 disposed between the parts 1301 and 1302 constitute an obstacle to the wiring, the above path determining method using the virtual net 1305 will come up with the wiring path 1306 shown in FIG. 13C which detours around the parts 1304.

This results in increased wiring length and increased wiring space, making it necessary to increase the area of the wiring board.

Therefore, the wiring design system preferably generates the wiring paths 1307 shown in FIG. 13D which run in a bundle before and after meeting the parts 1304 but separate at these parts so as to pass between them.

Further, another problem is that increased speed and increased density of semiconductor circuits have introduced various wiring restrictions. Floor plans have become important in designing wiring which satisfies these restrictions. A floor plan is a process of roughly drawing a wiring plan and a parts layout before the structure of the wiring board and the detailed wiring are designed. Thus, it is necessary to review the wiring restrictions and each possible wiring pattern in the early wiring design stage.

With the conventional technique, however, it is necessary to prepare information equivalent to that required for detailed wiring design, and furthermore preparation for checking each possible wiring pattern requires time and man-hours. Reviewing and modifying a floor plan also take a considerable amount of time since wiring information on each signal must be handled separately. Therefore, it is necessary to provide a system which draws a floor plan based on simple but practical information to considerably reduce the preparation period and which handles signals as a signal group to reduce the man-hours need to review and modify the floor plan.

The present invention has been devised to solve the above problems. It is, therefore, an object of the present invention to provide a wiring design system and method which is advantageous when applied to wiring boards having various wiring restrictions, wherein the system and method shows a rough wiring plan at the floor plan stage so as to complete a wiring design satisfying the wiring restrictions in a short period of time while evaluating the congestion degree of the wiring.

The present invention handles related signals such as those on a bus as a signal group, and first try to find a path for the signal group as a whole, that is, to ensure a wiring area for all signals in the group. If the above step has not been able to find a single wiring area for accommodating all signals in the signal group due to an obstacle, etc., then the present invention divides the signal group into smaller groups and try to find paths for them again.

At that time, the wiring paths for neighboring divided groups are designed to have the same shape so that these groups have the same wiring pattern.

When a (rough) wiring path has been specified for one of the signals in the signal group using simple information, the present invention regards it as being also applied to all other signals in the group and try to find a path for each signal, giving priority to the specified area (wiring path).

Further, the present invention first draws a rough wiring path based on temporary simple information and then evaluates the degree of congestion. The present invention gradually increases the accuracy of the information as the design progresses, replacing previous information with more practical information. At that time, only wiring sections for which no path has yet been determined due to insufficient information are subjected to reexamination (using more detailed information).

With this arrangement, the wiring design system of the present invention can find suitable wiring paths for signals (signal lines) that must be made equal in their characteristics, which is also advantageous in increasing the density of the wiring board. Furthermore, it is possible to design a floor plan taking account of the wiring restrictions and each possible wiring pattern on the wiring board in the early wiring board design stage.

BRIEF DESCRIPTION OF DRAWINGS

FIG. 1 is a diagram showing the configuration of a wiring design system according to the present invention.

FIG. 2 is a schematic diagram showing examples of the information contained in a path specification information file 104.

FIG. 8 is a schematic diagram illustrating processing flow in a wiring design system according to a second embodiment of the present invention.

DESCRIPTION OF PREFERRED EMBODIMENTS

Preferred embodiments of the present invention will be described below with reference to FIGS. 1 to 11.

First of all, description will be made of the configuration of a wiring design system according to the present invention with reference to FIGS. 1 to 3.

FIG. 1 is a diagram showing the configuration of a wiring design system according to the present invention.

FIG. 2 is a schematic diagram showing examples of the information contained in a path specification information file 104.

Figure 3:
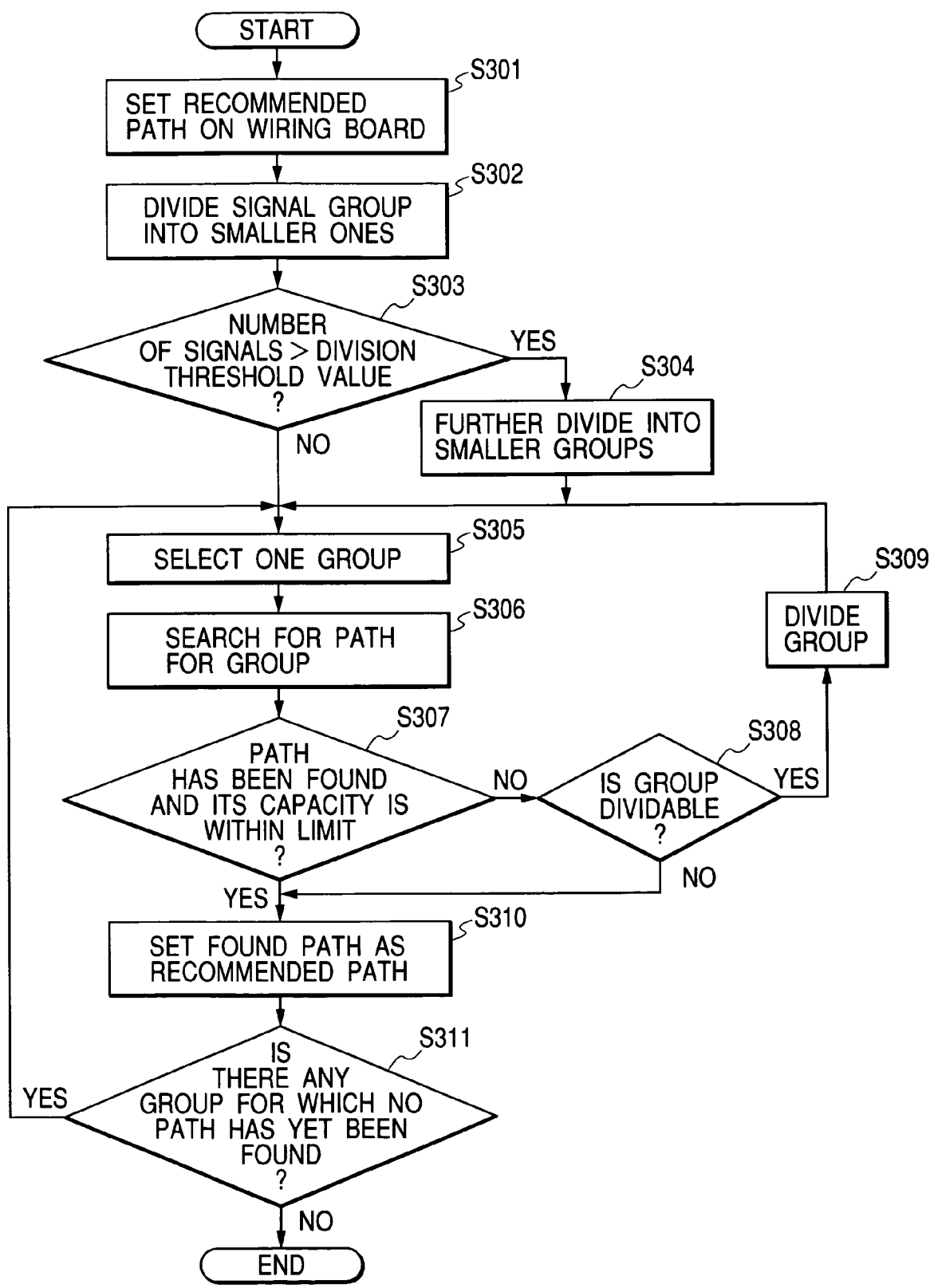
FIG. 3 is a flowchart showing the details of path search processing.

FIG. 3 is a flowchart showing the details of path search processing.

As shown in FIG. 1, an input processing section 107 of a wiring design system 101 receives input files such as a net information file 102, a signal group information file 103, a path specification information file 104, a layout specification information file 105, and a wiring restriction information file 106.

These input files are input to a wiring processing section 108 and used to change parts on the wiring board or to design wiring paths.

Output information is output through an output processing section 115 as output files such as a wiring path information file 116, a congestion degree evaluation file 117, and a layout information file 118.

It should be noted that the net information file 102 contains logical connection information on parts on the wiring board. The signal group information file 103 contains specification information on signal groups to be wired. A signal group is a concept used to handle a plurality of wires as a group, for example, as a bus. The path specification information file 104 contains rough specification information on wiring paths. The wiring restriction information 106 contains information on wiring restrictions such as those on wiring lengths and distances between neighboring signals.

The wiring path information file 116 contains wiring path information generated by the wiring processing section 108. The congestion degree evaluation file 117 contains the results of evaluating the congestion degrees of wiring paths based on generated wiring path information. The layout information file 118 contains parts layout information.

The path specification information in the path specification information file 104 may have the structure shown in FIG. 2. The path specification information specifies paths which signal groups should follow whenever appropriate. Each piece of path specification information includes information on a (signal) line, for example, a signal group name or a signal name, a start point, an end point, and a layer name, as shown in Table 201. Or it may include a signal group name or a signal name, two coordinates in a specified wiring area, and a layer number.

It should be noted that a signal group name and a signal name are the names of a signal group and a signal handled by a wiring design system of the present invention to design wiring. Any coordinate system can be used if it allows the wiring design system to easily design wiring. The layer name and the layer number are employed since multilayer wiring is formed.

Description will be made below of the details of the processing performed by the wiring processing section 108 of a wiring design system according to the present invention.

At step S01, the wiring processing section 108 selects a signal group for which no path has yet been found, based on information obtained from the input processing section 107. Then, the wiring processing section 108 searches for a path for the selected signal group at step S02.

After completing the path search, the wiring processing section 108 determines at step S03 whether there is another signal group for which no path has yet been found. If so, the above processing (steps S01 to S03) is repeated.

If, on the other hand, there is no other signal group for which no path has yet been found, then at step S04 the wiring processing section 108 evaluates the wiring, such as checking its degree of congestion or determining whether the wiring meets the wiring restrictions.

Step S05 determines whether the degree of congestion is high or there is any restriction which is not met. If it is determined that the degree of congestion is high or there is a restriction which is not met, the wiring processing section 108 changes the parts layout and the wiring path(s) at step S06. After that, the above processing (steps S01 to S05) is repeated.

If, on the other hand, it is determined that the degree of congestion is not high and there is no restriction which is not met, the wiring processing section 108 determines at step S07 whether the signal group can be divided into smaller groups. If it is determined that the signal group can be divided and the division threshold value is larger than the division limit value, the wiring processing section 108 reduce the division threshold value at step S08. At step S09, the wiring processing section 108 sets the found path as a recommended path. Then, the above processing is repeated. It should be noted that a division limit value is an externally supplied parameter for limiting the division operation.

If, on the other hand, the signal group cannot be divided or the division threshold value is smaller than the division limit value, the wiring processing section 108 supplies necessary information to the output processing section 115 which then takes over the processing.

Description will be made below of the details of the path search processing at step S02 with reference to FIG. 3.

First of all, the wiring processing section 108 sets the recommended path on the wiring board at step S301. A recommended path is a path which wiring should follow whenever appropriate and is specified by the path specification information 104. With the recommended path, it is possible to design desirable wiring considering the parts layout conditions on the wiring board. How to specify a recommended path will be described later in detail.

Then, the wiring processing section 108 divides the signal group into smaller groups at step S302. A signal group consists of signals whose wires are handled as a group. The wiring design systems of the present invention use signal groups as wiring units. At step S302, the signal group is divided such that neighboring signals in the signal group belong to the same group whenever possible. One of the characteristics of the present invention is in its method of dividing this signal group, as described later using specific examples. It should be noted that it may be arranged that differential signals in a pair always belong to the same group. The differential signals in a pair always have opposite levels and are effective in reducing external noise produced when signals are transmitted through wires at high speed. These differential signals need be transmitted adjacent to each other.

Then, the wiring processing section 108 determines at step S303 whether the number of signals in the signal group is larger than the division threshold value. If it is determined that the number of signals in the signal group is larger than the division threshold value, the signal group is further divided so that the number of signals is equal to or less than the division threshold value at step S304.

After that, one group is selected at step S305.

Then, the wiring processing section 108 searches for a path for the selected group at step S306. In the path search at step S306, priority is given to the recommended path. If it is determined at step S307 that a wiring path has been found and its capacity is within a limit, the wiring processing section 108 sets the found wiring path as a recommended path at step S310 so that paths adjacent to the found path can be searched for other groups within the signal group. It should be noted that step S310 will be further described later using specific examples.

If it is determined at step S307 that no wiring path has been found or the capacity of the found wiring path is over the limit, then the wiring processing section 108 determines at step S308 whether the signal group can be divided.

If the group can be divided, the wiring processing section 108 divides it at step S309 and then repeats the above processing starting with step S305. The group can be (or should be) divided, for example, when the resultant smaller groups are small enough to pass between parts blocking them (the original group cannot pass since it includes a large number of signals), or when the degree of congestion can be reduced through the division.

If, on the other hand, the group cannot be divided, the wiring processing section 108 sets the found wiring path as a new recommended path at step S310.

After step S310, the wiring processing section 108 determines at step S311 whether there is any group for which no path has yet been found. If yes, the wiring processing section 108 repeats the above processing starting with step S305. If no, the processing ends.

Description will be made below of path search processing using a recommended path in which a signal group is divided into smaller groups and of a technique for determining a wiring path according to a wiring design method of the present invention with reference to FIGS. 4 to 6.

Figure 4:
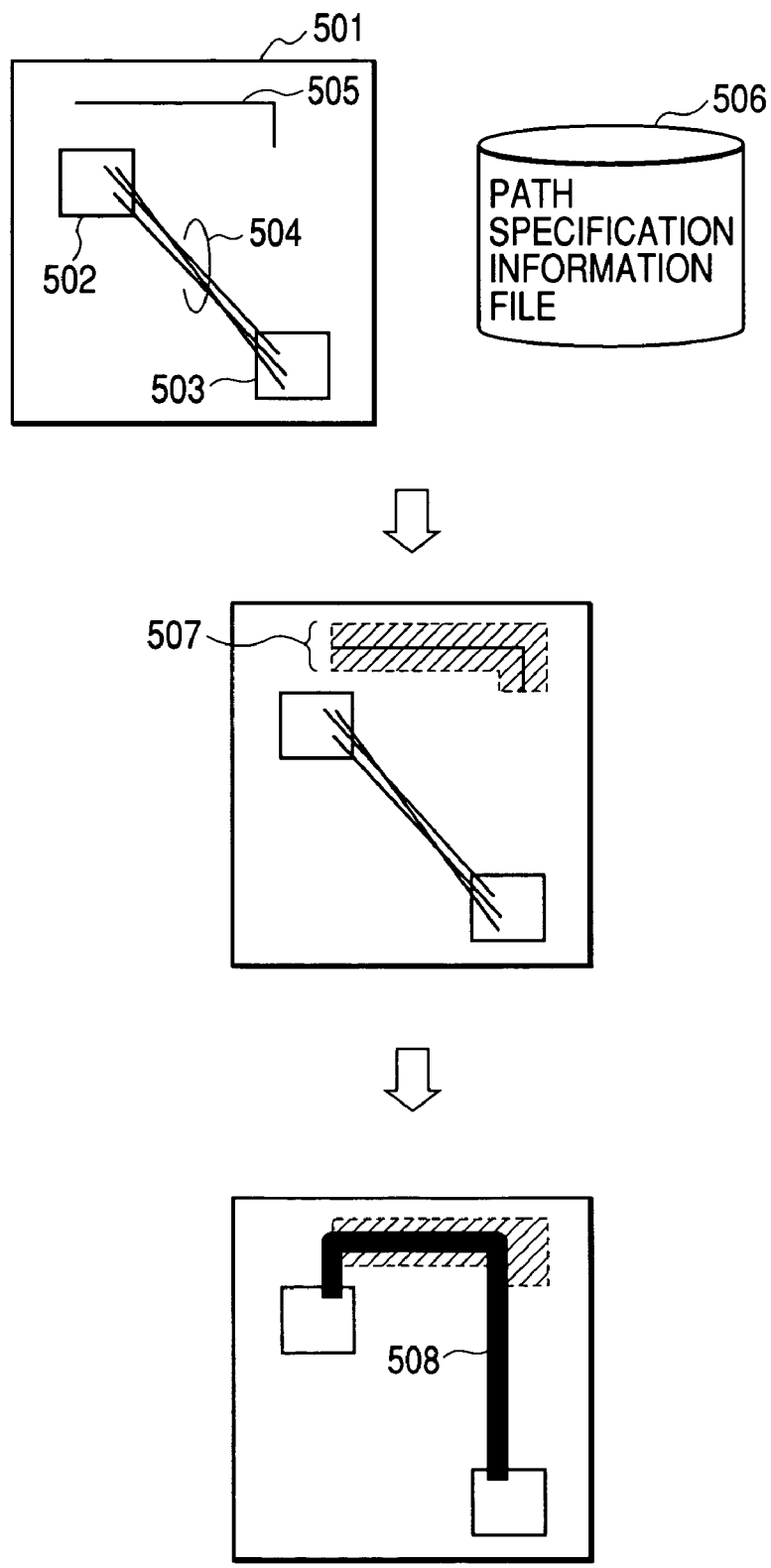
FIG. 4 is a diagram illustrating path search processing using a recommended path according to the present invention.

FIG. 4 is a diagram illustrating path search processing using a recommended path according to the present invention.

FIG. 5 includes FIGS. 5A to 5E which are diagrams illustrating path search processing according to the present invention, wherein a signal group is divided into smaller groups which run adjacent to one another.

Figure 6:
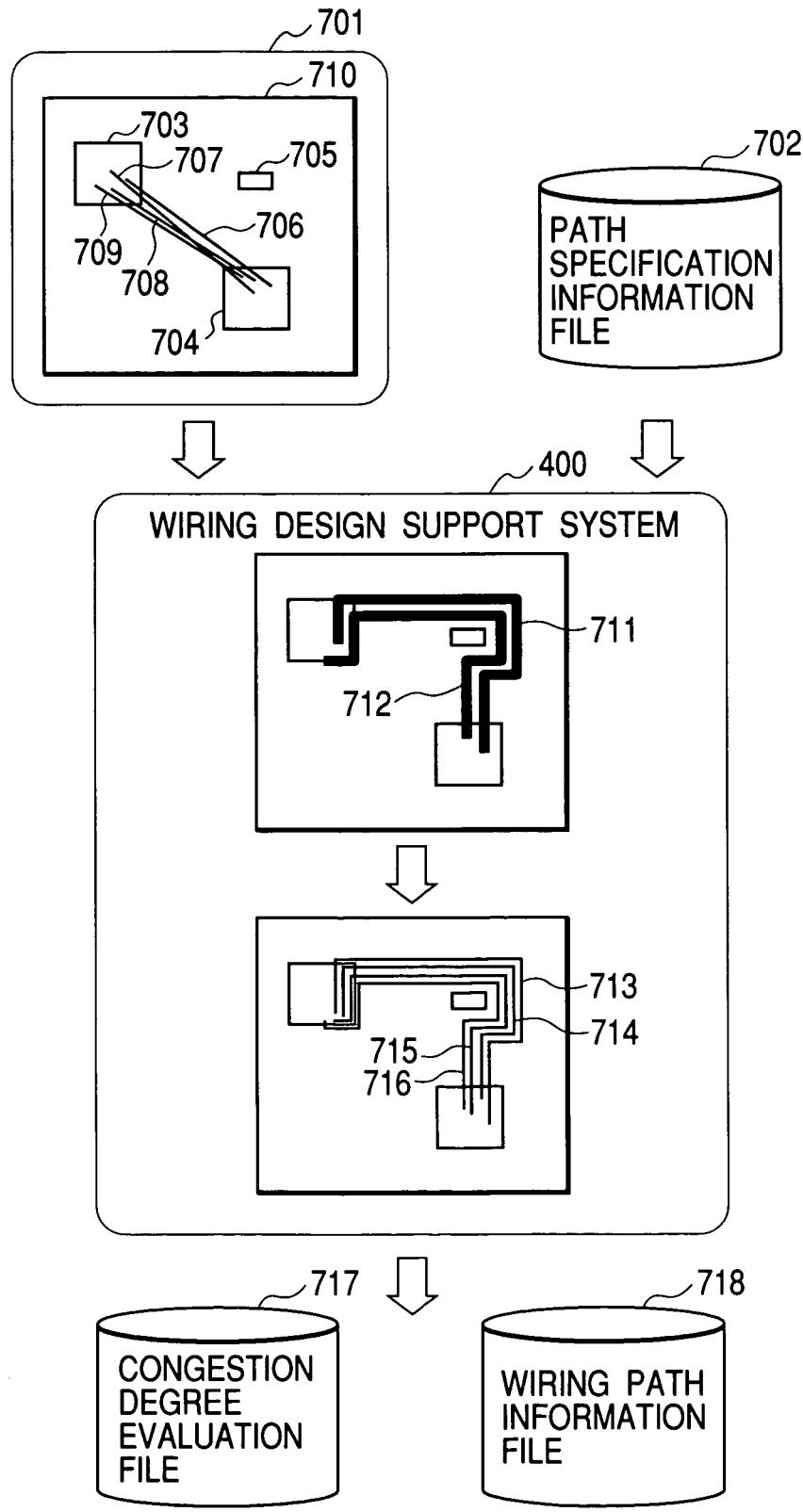
FIG. 6 is a diagram illustrating a procedure for determining a wiring path for a signal group.

FIG. 6 is a diagram illustrating a procedure for determining a wiring path for a signal group.

First of all, with reference to FIG. 4, description will be made of how to find a wiring path by specifying a recommended path as described above at step S301 of the flow-chart shown in FIG. 3.

Assume, for example, that parts 502 and 503 are mounted on a wiring board 501, and a signal group 504 is set between the parts 502 and 503.

To generate a desirable wiring pattern or to provide a base for that, a recommended path 505 is set for the signal group 504 from a path specification information file 506. This arrangement makes the changes to the wiring explicit.

The recommended path 505 is generated based on the path specification information stored in the path specification information file 506 shown in FIG. 2. A recommended path is a path which the signal group 504 should follow whenever appropriate. Each recommended path has a certain width so that all nets (signals) within the signal group can follow the path alongside of one another, as indicated by a recommended path 507 in FIG. 4. Thus, the path search processing generates a path which follows the recommended path 507 whenever appropriate, as indicated by a wiring path 508 in FIG. 4.

With reference to FIGS. 5A to 5E, description will be made below of how to arrange the wiring paths for groups obtained as a result of dividing a signal group at step S309 of the flowchart shown in FIG. 3 so that they run adjacent to one another.

Figure 5A:
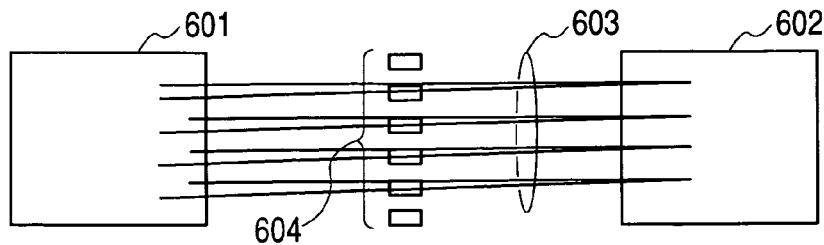
FIG. 5 includes FIGS. 5A to 5E which are diagrams illustrating path search processing according to the present invention, wherein a signal group is divided into smaller groups which run adjacent to one another.

Assume, for example, that a signal group 603 is set between parts 601 and 602 which sandwich a plurality of parts 604, as shown in FIG. 5A.

In such a case, it is not possible to set a single straight path accommodating the entire signal group 603 since the path must detour around the parts 604, which is not desirable in terms of wiring design. Therefore, the signal group 603 is divided into smaller groups such that they can pass between the parts 604, and then paths for them are searched for, as follows.

Figure 5B:
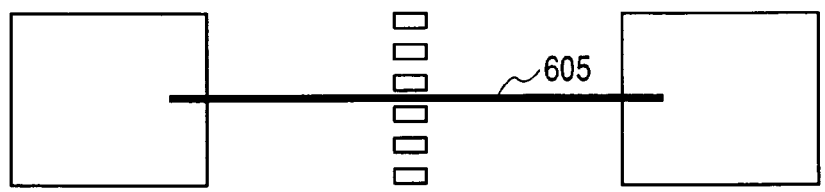
Figure 5C:
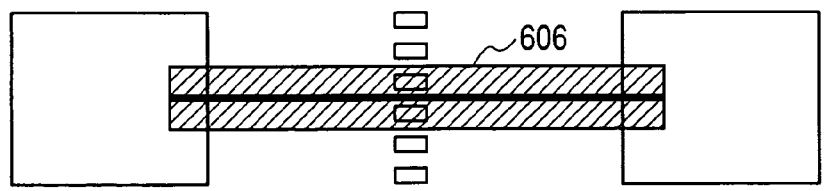
Figure 5D:
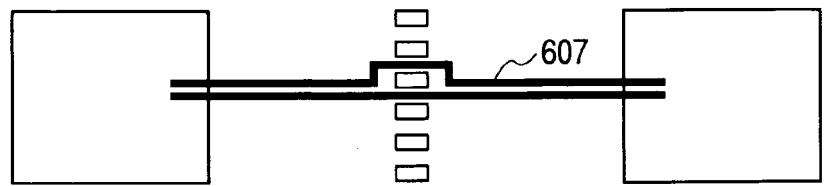

First, as shown in FIG. 5B, a wiring path 605 for one of the groups is determined which passes between two parts 604. Then, the wiring path 605 is widened and registered as a recommended path 606 (step S310 in FIG. 3), as shown in FIG. 5C. A wiring path 607 for another one of the groups is determined such that it runs within the recommended path, as shown in FIG. 5D.

The above arrangement (in which the wiring path 605 is widened and registered as a new recommended path) allows the next path to run adjacent to the wiring path 605 (that is, it can be disposed close to the target part 604).

Figure 5E:
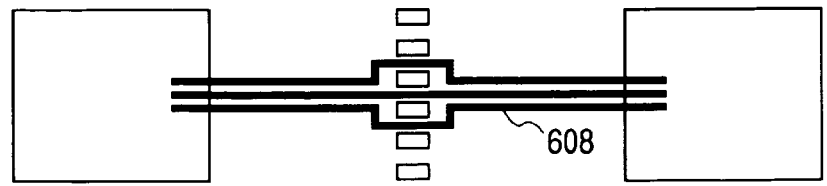

The above processing is repeated, thereby determining a wiring path 608, as shown in FIG. 5E.

Description will be made below of a procedure for determining a wiring path for a signal group with reference to FIG. 6.

Assume, for example, that parts 703, 704, and 705 are mounted on a wiring board 710, and connection lines for a single signal group are set between the parts 703 and 704 as connection information 706, 707, 708, and 709.

Net information 701 and path specification information 702 on the wiring board 710 are input to the wiring design system 400.

The wiring design system 400 searches for a path for the signal group or for each group obtained as a result of dividing the signal group, generating wiring paths 711 and 712. After that, the wiring design system 400 generates detailed wiring paths 713, 714, 715, and 716 based on the path for the signal group or for each group. Thus, the wiring design system 400 determines appropriate paths by dividing a signal group into smaller groups and finding a path for each group (even for each signal).

Lastly, after determining the wiring paths, the wiring design system 400 outputs a congestion degree evaluation file 717 and a wiring path information file 718.

A first embodiment of the present invention will be described below with reference to FIG. 7.

Figure 7:
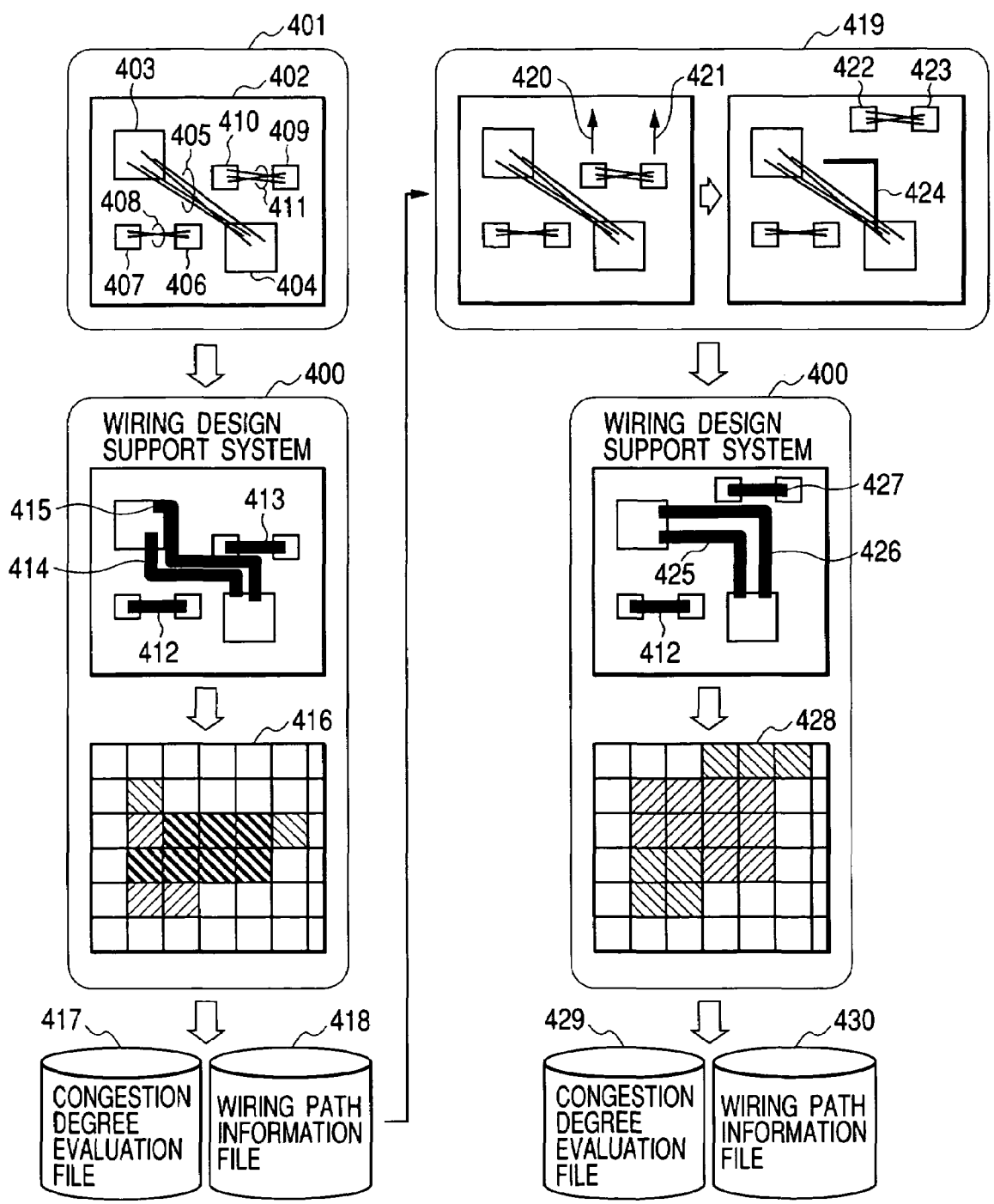
FIG. 7 is a schematic diagram illustrating processing flow in a wiring design system according to a first embodiment of the present invention.

FIG. 7 is a schematic diagram illustrating processing flow in a wiring design system according to the first embodiment of the present invention.

The present embodiment generates an optimum wiring design by changing the parts layout and setting a recommended path based on evaluation of the degree of congestion.

According to the present embodiment, net information 401 on a wiring board 402 indicates that parts 403, 404, 406, 407, 409, and 410 are mounted on the wiring board 402, as shown in the upper-left corner of FIG. 7.

Connection lines for one signal-group are set between the parts 403 and 404 as connection information 405. Likewise, connection lines for another signal group are set between the parts 406 and 407 as connection information 408. Further, connection lines for still another signal group are set between the parts 409 and 410 as connection information 411.

The wiring design system 400 receives these pieces of information and determines or ensures wiring paths for the signals in each signal group, thus generating wiring paths 412, 413, 414, and 415. The wiring design system 400 then evaluates the wiring and obtains a congestion degree evaluation result 416. The degree of congestion is obtained by dividing the entire wiring area into small regions by horizontal and vertical dividing lines at equal intervals and then measuring the amount of wiring in each small region. At this point, the wiring design system 400 can output a congestion degree evaluation file 417, which contains the results of evaluating the congestion degrees of wiring paths, and a wiring path information file 418, which contains information on determined wiring paths.

The congestion degree evaluation result 416 indicates that the wiring paths 413, 414, and 415 run very close to one another, that is, the congestion degree of the determined wiring paths is partially high.

To solve this problem, the parts layout and the wiring paths are modified as follows. After reviewing the parts layout, the parts 409 and 410 are moved in the directions indicated by arrows 420 and 421, respectively.

Further, a recommended path 424 is set for the signal group 405 to modify the wiring path.

These measures are expected to reduce the congestion degree of the center portion of the wiring board. Then, the wiring design system 400 searches for wiring paths for the signal groups again using wiring path information 419, which includes information on the above changes in the parts layout and on the new recommended path.

As a result, the wiring design system 400 obtains new wiring paths 425, 426, and 427. The wiring design system 400 then evaluates the wiring thus generated and obtains a congestion degree evaluation result 428. At this point, the wiring design system 400 can generate a new congestion degree evaluation file 429 and a new wiring specification information file 430. The above processing is repeated until no portion of the wiring board is too high in the degree of congestion.

A second embodiment of the present invention will be described below with reference to FIG. 8.

FIG. 8 is a schematic diagram illustrating processing flow in a wiring design system according to the second embodiment of the present invention.

The present embodiment designs wiring by considering restrictions on wiring lengths and on distances between neighboring wires.

Assume, for example, that parts 802 and 803 are mounted on a wiring board 808, and signals 804, 805, 806, and 807 are set between the parts 802 and 803. The signals 804 and 805 belong to one signal group, while the signals 806 and 807 belong to another signal group.

Furthermore, the wiring board has wiring restrictions. Specifically, a wiring restriction information file 812 contains neighboring wire restriction information 810 and wiring length restriction information 811. The neighboring wire restriction information 810 indicates restrictions on wiring distances between neighboring signal groups, while the wiring length restriction information 811 indicates restrictions on the wiring length tolerance and the wiring length for each signal group. Since these pieces of information are registered only for each signal group, a signal group information file 809 is prepared as a table for associating each signal with a signal group (listing each signal name and its corresponding signal group name).

Here, assume that the signals 804 and 805 belong to a signal group grpA and the signals 806 and 807 belong to a signal group grpB. Further, the neighboring wire restriction information 810 and the wiring length restriction information 811 indicate, for example, that the signal groups grpA and grpB should be spaced 1.27 mm or more apart, the wiring length tolerance of each signal wire in the signal group grpA is ʲ3 mm, and the wiring length restriction on the signal group grpA is 50 mm or less.

The wiring design system receives the net information file 801, the signal group information file 809, and the wiring restriction information file 812 which contain information on the wiring board 808.

Based on the neighboring wire restriction information 810, the wiring design system 400 generates wiring paths 813 and 814 which meet the restrictions on the wiring distances between neighboring signal groups. Then, the wiring design system 400 searches for a wiring path for each signal in each signal group based on the wiring paths 813 and 814 for the signal groups, generating the wiring paths 815 and 816 (which belong to the wiring path 813) and the wiring paths 817 and 818 (which belong to the wiring path 814) such that that these generated wiring paths satisfy the neighboring wire restriction information 810 and the wiring length restriction information 811.

After that, the wiring design system 400 outputs a congestion degree evaluation file 819 and a wiring path information file 820.

A third embodiment of the present invention will be described below with reference to FIG. 9.

Figure 9:
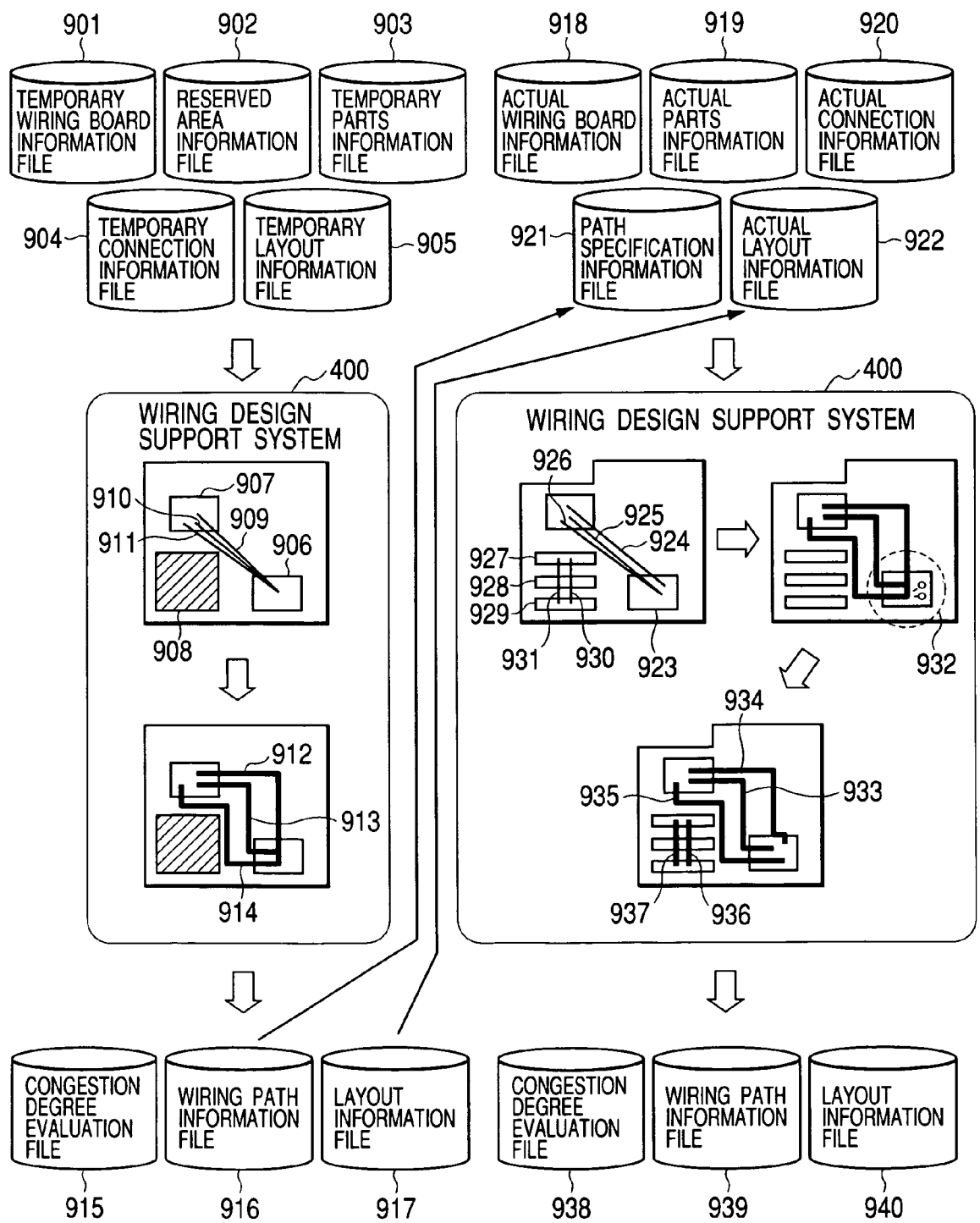
FIG. 9 is a schematic diagram illustrating processing flow in a wiring design system according to a third embodiment of the present invention.

FIG. 9 is a schematic diagram illustrating processing flow in a wiring design system according to the third embodiment of the present invention.

The present embodiment first generates "temporary wiring" based on temporary information and then changes it into "actual wiring". The present embodiment is advantageous when it takes a long time to determine a final parts layout, wiring, etc. on a wiring board.

That is, the wiring design system receives rough information about the wiring board, connections between the parts, and the pin assignments and the layout of parts on the wiring board, and then determines a temporary optimum parts layout and temporary optimum wiring at this point based on the rough information. After that, the wiring design system breaks down the arrangement using detailed information obtained from the temporary optimum parts layout and temporary optimum wiring described above so as to generate a detailed parts layout and detailed wiring.

According to the present embodiment, "temporary information" files for wiring design are input to the wiring design system 400.

A temporary wiring board information file 901 roughly defines the size of the wiring board. A reserved area information file 902 specifies regions reserved for logic circuit parts, etc. on the wiring board.

A temporary parts information file 903 contains information on temporary parts which are used to prepare information on the number and the positions of the pins of each actual part to be mounted on the wiring board. The temporary net information file 904 contains information roughly indicating the numbers of connections between parts, that is, connection information before information on the pins is taken into account. A temporary layout information file 905 roughly defines the layout position of each part.

The wiring design system 400 generates a temporary optimum wiring design based on the input rough information. Then, the wiring design system 400 outputs a congestion degree evaluation file 915, a wiring path information file 916, and a layout information file 917 as a result of evaluating the degree of wiring congestion.

Thus, the above temporary information files are input to the wiring design system 400. This allows the wiring design system 400 to obtain information about a temporary part 906 (whose pin positions are only roughly specified on a temporary wiring board), a part 907 (which is an actual part), a reserved area 908, a temporary part 906, and signal groups 909, 910, and 911 set between the temporary part 906 and the actual part 907.

It should be noted that "temporary part" refers to a part which has not been fully specified, while "actual part" refers to a part which has been fully specified.

As shown in the left-hand side of FIG. 9, the part 906 is a temporary part, as described above, and its size and the number and the positions of its pins have not been fully specified. The part 907 is an actual part, as described above. Furthermore, the reserved area 908 is set on the wiring board.

In this case, the wiring design system 400 searches for a wiring path on the assumption that all pins of the temporary part 906 are disposed at its center. In the path search processing, the wiring design system 400 generates wiring paths 912, 913, and 914 obtained as a result of avoiding passage through the reserved area 908 whenever possible. Further, when the wiring between the temporary part 906 and the actual part 907 is designed, it is assumed that the terminals of the temporary part 906 are disposed at its center.

Thus, the wiring design system 400 generates an appropriate parts layout and appropriate wiring paths based on the temporary information, producing a congestion degree evaluation file 915, a wiring path information file 916, and a layout information file 917. As the design progresses, the wiring design system 400 generates actual information. The wiring design system 400 replaces the temporary information files with the corresponding actual information files such as an actual wiring board information file 918, an actual parts information file 919, an actual connection information file 920, and an actual layout information file 922, one after another, to increase the accuracy of the wiring design. Furthermore, the wiring design system 400 receives a path specification information file 921 created based on the wiring path information file 916 generated using the temporary information files. The wiring design system 400 also receives an actual layout information file 922 created based on the information in the layout information file 917, actual wiring board information, and actual parts information.

The actual connection information file 920 contains wiring information including the actual pin positions of parts.

The actual layout information file 922 specifies actual parts layouts and corresponds to the reserved area information file 902 and the temporary layout information file 905.

It should be noted that the path specification information file 921 specifies paths to be initially used for path search processing and is created based on wiring information generated using the temporary information.

The parts 923 and 907 and the parts 927 to 929 are mounted on the actual wiring board. Signal groups 924, 925, and 926 are set between the parts 923 and 907, while signals groups 930 and 931 are set between the parts 927 and 928 and between the parts 928 and 929.

The reserved area 908 has been replaced by the area in which the parts 927 to 929 are disposed. The wiring design system 400 searches for paths between the parts 923 and 907 using as recommended paths the wiring paths 912, 913, and 914 generated at the previous step. The wiring design system 400 also determine the positions of the pins of a part 932, to which the recommended paths have not yet been connected.

The wiring design system 400 then designs (detailed) wiring using the results of wiring based on the temporary information, generating wiring paths 933, 934, and 935 obtained after determining the actual pin positions of the part.

The wiring design system 400 searches for appropriate paths for the new parts 927 to 929 and, as a result, generates wiring paths 936 and 937.

After completing the wiring design, the wiring design system outputs a congestion degree evaluation file 938, a wiring path information file 939, and a layout information file 940. Thus, the present embodiment makes it possible to roughly design wiring based on rough information and check it in the floor plan stage (early design stage) before generating detailed wiring. The rough wiring (temporary wiring) is effectively used to generate actual wiring on an actual wiring board.

A fourth embodiment of the present invention will be described below with reference to FIG. 10.

Figure 10:
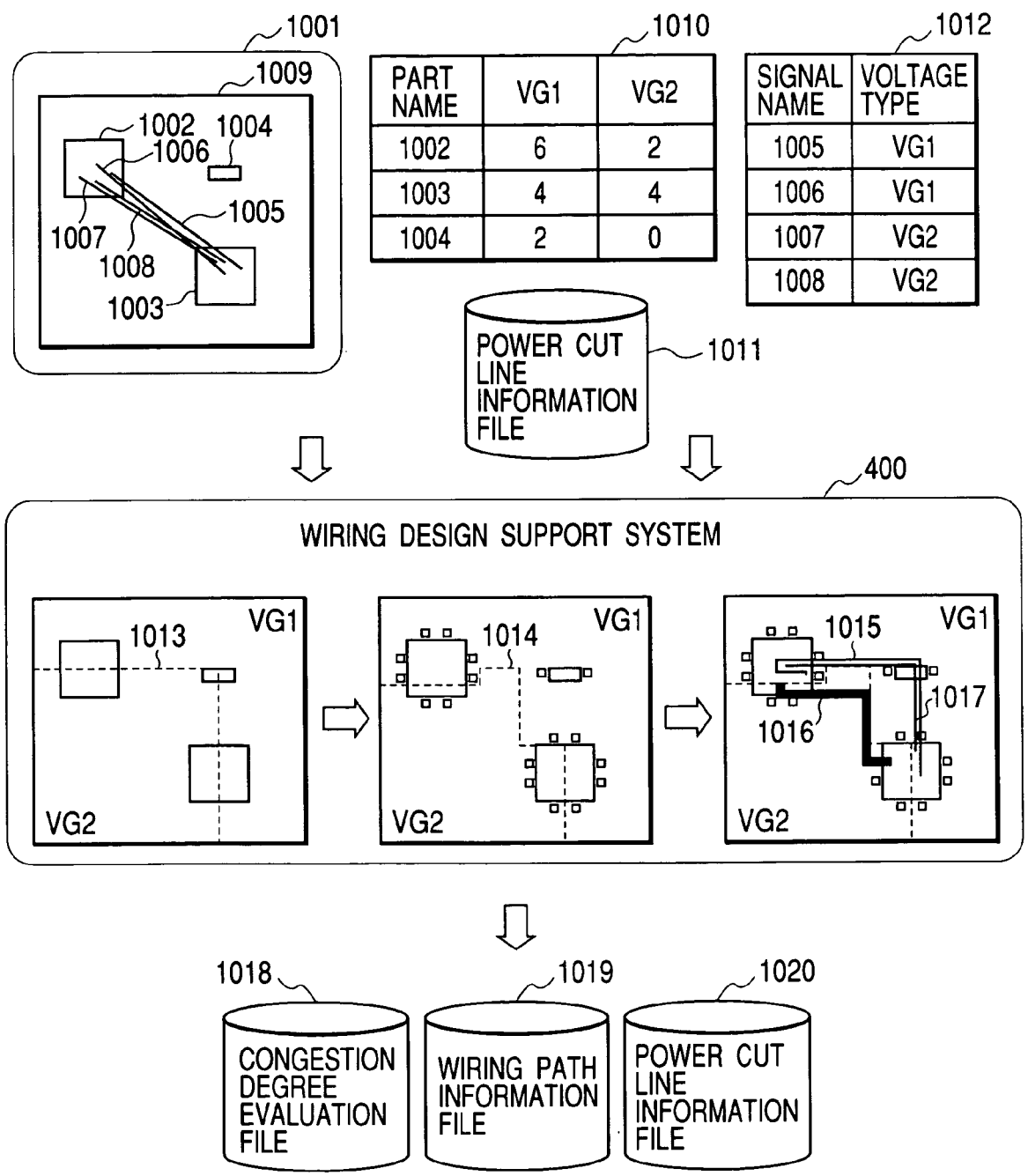
FIG. 10 is a schematic diagram illustrating processing flow in a wiring design system according to a fourth embodiment of the present invention.

FIG. 10 is a schematic diagram illustrating processing flow in a wiring design system according to the fourth embodiment of the present invention.

The present embodiment makes it possible to design wiring by considering information about capacitors and power cut lines on an electronic wiring board.

Assume, for example, that parts 1002, 1003, and 1004 are mounted on a wiring board 1009. Between the parts 1002 and 1003 are disposed connection lines for one signal group defined as connection information 1005 and 1006 and connection lines for another signal group defined as connection information 1007 and 1008.

A capacitor information file 1010 is also defined which contains information on the required number of capacitors for each voltage type for each part. For example, the part 1002 requires 6 capacitors of VG1 voltage type and 2 capacitors of VG2 voltage type.

Further, a table 1012 is defined which lists each signal and its voltage type. This table indicates, for example, that the signals 1005 and 1006 should be set in an area to which a voltage of VG1 type is supplied.

Still further, a power cut line information file 1011 is defined which contains rough information on power cut lines on the wiring board. A power cut line indicates a border between voltage types supplied to the wiring board.

The wiring design system 400 of the present embodiment receives net information 1001 specifying the wiring board, the capacitor information file 1010, the power cut line information file 1011, and the table 1012 for listing each signal and its voltage type.

The wiring design system 400 then arranges the required number of capacitors around each target part according to a rough power cut line by use of the capacitor information file 1010. After that, the wiring design system 400 corrects the power cut line based on the capacitor arrangement, producing a power cut line 1014. Then, wiring design system 400 determines wiring paths based on the resultant arrangement.

At that time, the wiring design system 400 generates signal wires above and below the power cut line such that they do not cross the power cut line. Then, the wiring design system 400 shifts and thereby corrects the power cut line again based on the congestion degree of the obtained wiring paths 1015, 1016, and 1017. After that, the wiring design system 400 outputs a congestion degree evaluation file 1018, a wiring path information file 1019, and a corrected power cut line information file 1020. Thus, the present embodiment can design the power supply portion, including capacitors and power cut lines, and the wiring portion at the same time, thereby completing the floor plan and the power design in a short period of time.

A fifth embodiment of the present invention will be described below with reference to FIG. 11.

Figure 11:
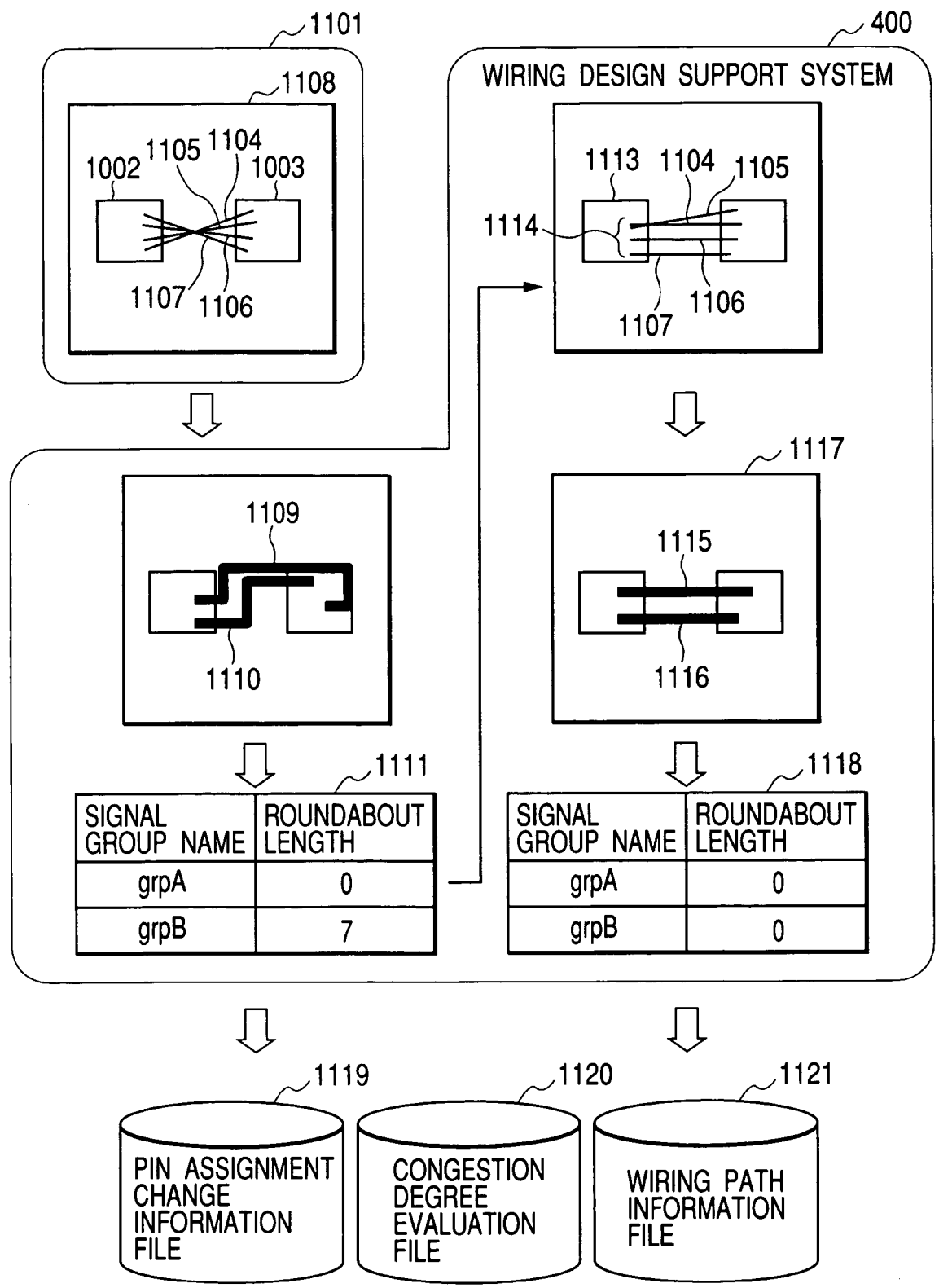
FIG. 11 is a schematic diagram illustrating processing flow in a wiring design system according to a fifth embodiment of the present invention.
Figure 12:
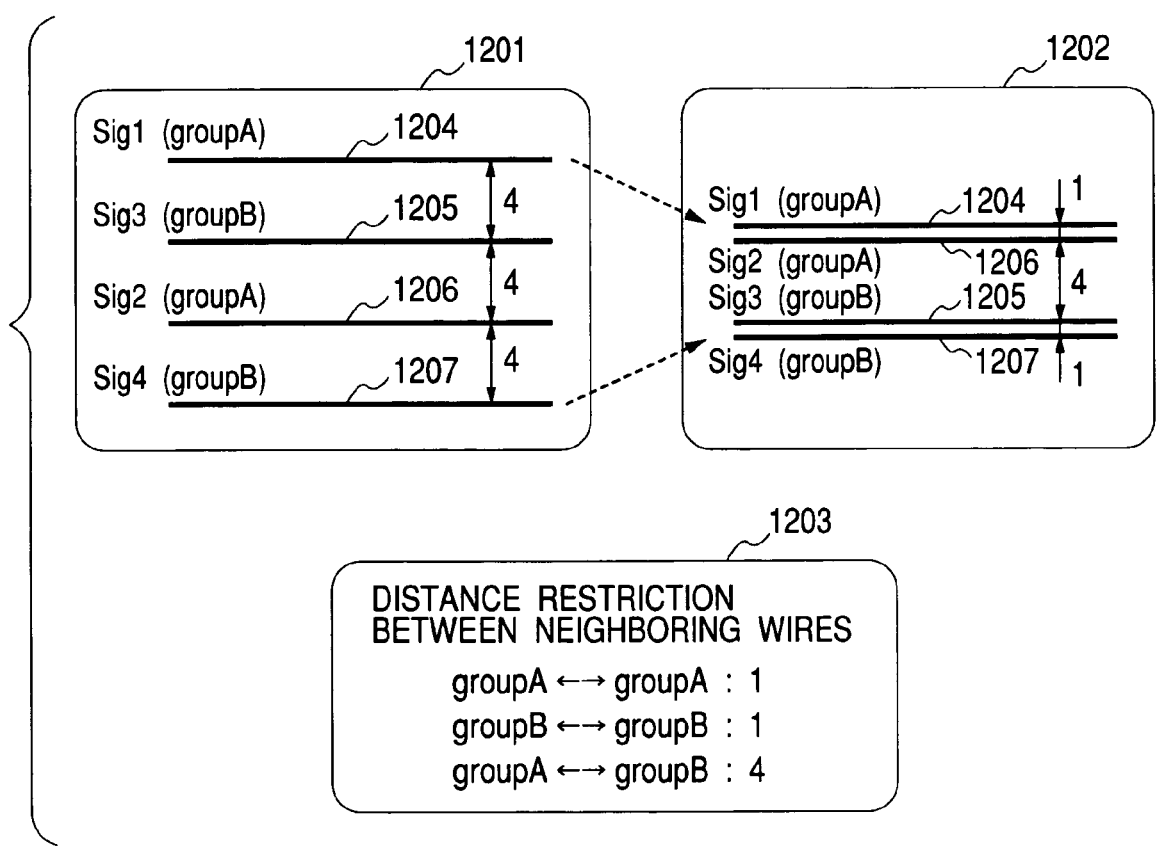
FIG. 12 is a schematic diagram showing an example of how to lay out signal (line) groups having proximity wiring restrictions.
Figure 13A:
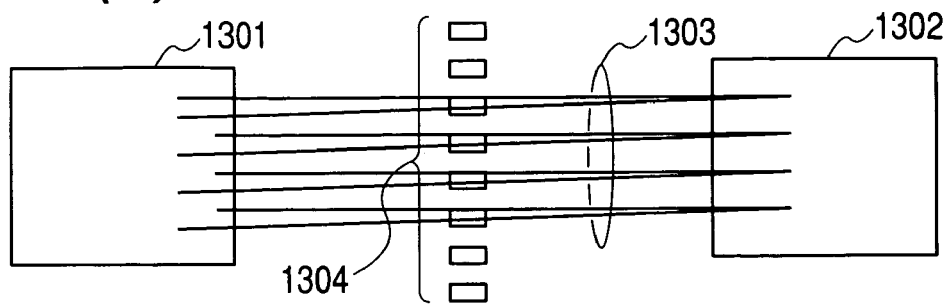
FIG. 13 includes FIGS. 13A to 13D which are diagrams illustrating wiring patterns formed when parts block wiring on a wiring board.
Figure 13B:
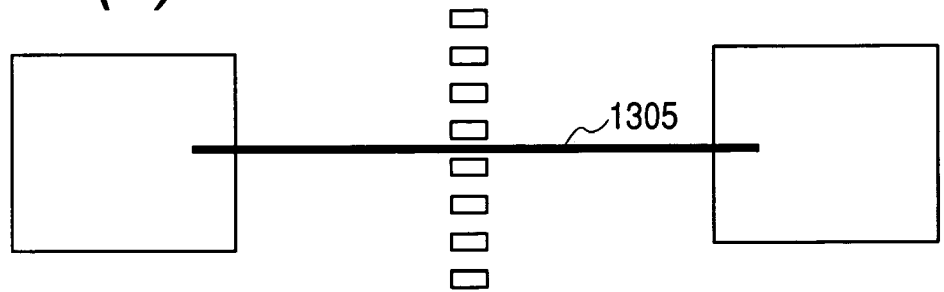
Figure 13C:
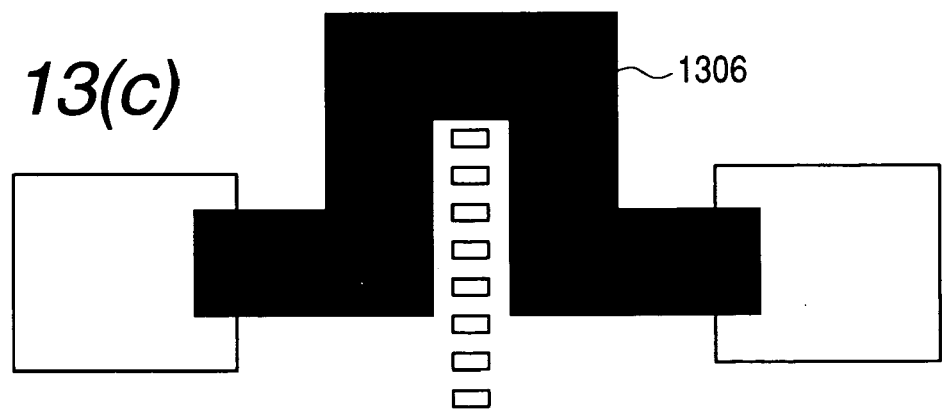
Figure 13D:
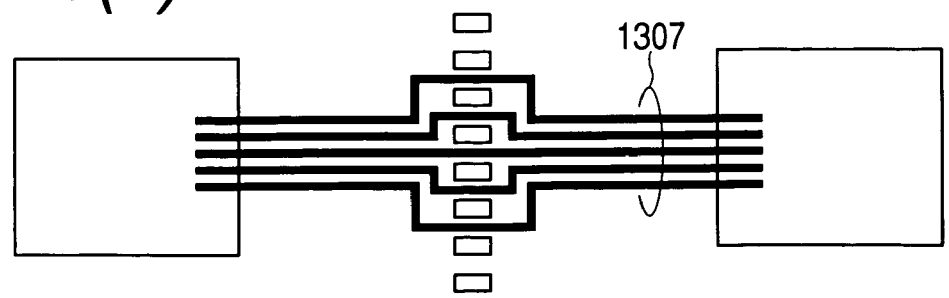

FIG. 11 is a schematic diagram illustrating processing flow in a wiring design system according to the fifth embodiment of the present invention.

The present embodiment changes the pin assignments of parts in wiring design.

Assume, for example, that parts 1102 and 1103 are mounted on a wiring board 1108. Between the parts 1102 and 1103 are disposed connection lines for one signal group defined as connection information 1104 and 1105 and connection lines for another signal group defined as connection information 1106 and 1107.

The wiring design system 400 of the present embodiment receives a net information file 1101 specifying the wiring board 1108 and performs path search processing. As a result, the wiring design system 400 generates wiring paths 1109 and 1110, and then evaluates their lengths. In the evaluation, if there is a path whose wiring length and Manhattan length (the shortest path between parts formed using horizontal and vertical lines) considerably differ from each other, as shown in table 1111 (listing the results of evaluating the roundabout lengths), the wiring design system 400 reviews the pin assignments. It should be noted that the wiring design system 400 may employ another pin assignment evaluation method instead and if the evaluation result indicates that there is a problem with the wiring design, the wiring design system 400 may review the pin assignments.

In the example of FIG. 11, a signal group grpB has a very long roundabout length (7).

Therefore, the wiring design system 400 performs path search processing again after replacing the part 1002 by a part 1113 with new pin assignment 1114. As a result, the wiring design system 400 generates wiring paths 1115 and 1116, and then evaluates their lengths. In the evaluation, if there is no path whose wiring length and Manhattan length considerably differ from each other, as shown in the table 1118 (listing the results of evaluating the roundabout lengths), the wiring design system 400 ends the path search processing, outputting pin assignment change information 1119, a congestion degree evaluation file 1120, and a wiring path information file 1121.

The present invention can provide a wiring design system and method which is advantageous when applied to wiring boards having various wiring restrictions, wherein the system and method shows a rough wiring plan at the floor plan stage so as complete a wiring design satisfying the wiring restrictions in a short period of time while evaluating the congestion degree of the wiring.

What is claimed is:

1. A wiring design system for designing wiring for parts on a wiring board, comprising:
input means for inputting logical connection information on said parts on said wiring board and signal group information for handling said connection information as a signal group;
wiring processing means for determining a wiring path for said parts, said wiring processing means performing steps of handling said signal group as a wiring unit for a wiring path search and dividing said signal group into smaller groups, and arranging said divided smaller groups such that they run adjacent to one another; and output means for outputting wiring path information on said wiring path determined by said wiring processing means.

2. The wiring design system as claimed in claim 1, wherein when dividing said signal group into said smaller groups, said wiring processing means evaluates layout conditions of said parts on said wiring board or a congestion degree of wiring on said wiring board to determine said wiring path.

3. The wiring design system as claimed in claim 1, wherein said wiring processing means determines said wiring path based on a recommended path which said signal group should follow whenever appropriate.

4. The wiring design system as claimed in claim 1, wherein:

when dividing said signal group into said smaller groups, said wiring processing means uses wiring path information obtained as a result of searching for a path for said signal group as a whole;

said wiring processing means registers said wiring path information as a recommended path; and said wiring processing means recursively repeats said division and said wiring path search using each divided smaller group obtained at a previous recursive step as the new signal group.

5. The wiring design system as claimed in claim 4, wherein said wiring processing means recursively repeats said division of said signal group and said wiring path search using each divided smaller group obtained at a previous recursive step as the new signal group until said wiring processing means determines a wiring path for each signal.

6. The wiring design system as claimed in claim 1, wherein said logical connection information is temporary information prepared on the assumption that terminals of each part are disposed at its center.

7. The wiring design system as claimed in claim 1, wherein said wiring processing means determines said wiring path by considering wiring restrictions on wiring length or on neighboring signals.

8. The wiring design system as claimed in claim 1, wherein said wiring processing means determines wiring by considering a capacitor or a power cut line on said wiring board.

9. The wiring design system as claimed in claim 1, wherein after determining said wiring path, said wiring processing means calculates and outputs a congestion degree of wiring.

10. A wiring design method for designing wiring for parts on a wiring board, comprising:

a first step of inputting logical connection information for wiring said parts and signal group information for handling said connection information as a signal group;

a second step of handling said signal group as a wiring unit for searching for a wiring path for said parts, and dividing said signal group into smaller groups;

a third step of evaluating layout conditions of said parts on said wiring board or a congestion degree of wiring on said wiring board;

a fourth step of changing a layout of said parts; and a fifth step of, by considering said layout conditions of said parts on said wiring board or said congestion degree of said wiring on said wiring board, determining an optimum path in such a way that said divided smaller groups run adjacent to one another, and obtaining wiring path information.

11. The wiring design method as claimed in claim 10, further comprising:

a sixth step of, when said fifth step of obtaining said wiring path information is performed, determining said wiring path information based on a recommended path in such a way that said signal group runs within said recommended path or as close to said recommended path as possible, wherein said sixth step is recursively repeated using the wiring path determined at a previous recursive step as the new recommended path.

12. The wiring design method as claimed in claim 10, wherein when said sixth step is recursively repeated, pin assignments of said parts are optimized.

* * * * *